United States Patent [19]
Davis et al.

[11] Patent Number: 5,230,982
[45] Date of Patent: Jul. 27, 1993

[54] PHOTOINITIATOR COMPOSITIONS CONTAINING DISULFIDES AND PHOTOHARDENABLE COMPOSITIONS CONTAINING THE SAME

[75] Inventors: Paul D. Davis, Centerville; Jacqueline G. Truini, Dayton; David A. Hutchings, Centerville, all of Ohio

[73] Assignee: The Mead Corporation, Dayton, Ohio

[21] Appl. No.: 795,282

[22] Filed: Nov. 19, 1991

Related U.S. Application Data

[63] Continuation of Ser. No. 521,290, May 9, 1990, abandoned, which is a continuation-in-part of Ser. No. 321,257, Mar. 9, 1989, abandoned.

[51] Int. Cl.$^5$ .................. G03C 1/73; G03F 7/031
[52] U.S. Cl. .................. 430/138; 430/281; 430/920; 522/25; 522/26; 522/27; 522/54
[58] Field of Search .................. 430/138, 281, 920; 522/25, 26, 27, 54; 502/167

[56] References Cited

U.S. PATENT DOCUMENTS

| | | | |
|---|---|---|---|
| 2,460,105 | 1/1949 | Richards | 204/162 |
| 3,328,368 | 6/1967 | Wang | 522/27 |
| 3,450,612 | 6/1969 | Rudolph et al. | 204/158.15 |
| 3,847,771 | 11/1974 | McGinnis | 522/16 |
| 3,899,338 | 8/1975 | Lewis | 96/115 P |
| 3,954,584 | 5/1976 | Miyata et al. | 204/159.23 |
| 4,168,981 | 9/1979 | Donald et al. | 96/115 P |
| 4,304,841 | 12/1981 | Horn | 430/286 |
| 4,399,209 | 8/1983 | Sanders et al. | 430/138 |
| 4,440,846 | 4/1984 | Sanders et al. | 430/138 |
| 4,465,826 | 8/1984 | Wellner et al. | 502/167 |
| 4,548,689 | 10/1985 | Sakashita et al. | 522/26 |
| 4,772,530 | 9/1988 | Gottschalk et al. | 430/138 |
| 4,772,541 | 9/1988 | Gottschalk et al. | 430/339 |
| 4,840,866 | 6/1989 | Kovacs et al. | 430/138 |
| 4,842,980 | 6/1989 | Gottschalk et al. | 430/138 |
| 4,842,981 | 6/1989 | Sanders et al. | 430/138 |
| 4,918,114 | 4/1990 | Kuriyama et al. | 522/27 |
| 4,954,415 | 9/1990 | Davis et al. | 522/26 |
| 5,079,126 | 1/1992 | Hipps, Sr. et al. | 522/15 |

FOREIGN PATENT DOCUMENTS 6413144 1/1989 Japan .

OTHER PUBLICATIONS

Yoneda et al., "A New Hydrogen-Abstracting Reaction with Diethyl Azodicarboxylate", JACS, 88:10 (1966).
Mukaiyawa et al., "A Convenient Method for the Preparation of Unsymmetrical Disulfides by the Use of Diethyl Axodicarboxylate", *Tetrahedron Ltrs.*, 5907-5908 (1968).
Stewart et al. "Synthesis of Derivatives of 4,5-Dimethyl-2-Mercaptothiazol", *J. Org. Chem.*, 14 (1949).
Kuhle, "One Hundred Years of Sulfenic Acid Chemistry IIb. Substitution and Cyclization of Sulfenic Halides", *Synthesis* (1970).

*Primary Examiner*—Marion E. McCamish
*Assistant Examiner*—Christopher D. Rodee
*Attorney, Agent, or Firm*—Thompson, Hine and Flory

[57] ABSTRACT

A photohardenable composition comprising a free radical addition polymerizable or crosslinkable compound, an ionic dye/reactive counter ion complex capable of absorbing actinic radiation and producing free radicals which initiate free radical polymerization or crosslinking of the polymerizable or crosslinkable compound, and a disulfide represented by the structure

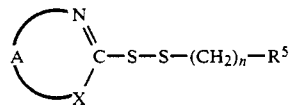

wherein X is selected from the group consisting of S and O except in a specific case in which the disulfide is derived from one or more tetrazolyl groups; n represents 0 or 1; A represents the residue of the ring containing the N, C and X atoms, the ring containing five or six members and, in addition, said ring members may be fused to an aromatic ring; and $R^5$ is an aromatic radical selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring.

18 Claims, No Drawings

PHOTOINITIATOR COMPOSITIONS CONTAINING DISULFIDES AND PHOTOHARDENABLE COMPOSITIONS CONTAINING THE SAME

This application is a continuation of Ser. No. 07/521,290, filed May 9, 1990, now abandoned, which is a continuation-in-part of Ser. No. 07/321,257 filed Mar. 9, 1989, now abandoned.

BACKGROUND OF INVENTION

For about a half a century it has been known that some aromatic disulfides are effective in the polymerization of ethylenically unsaturated organic compounds, but to this date, not much is known about how, why, and under what conditions they are effective, if at all they are.

This invention is particularly related to novel disulfides distinguished by their intra-ring linkage, and their use in photosensitive materials (commercially available under the Cycolor* trademark) of the general type comprising a laming support having a layer of microcapsules on one surface thereof. Encapsulated is a photosensitive free radical, addition-polymerizable composition containing an autooxidizer which functions as a co-initiator to enhance the speed of a polymerization reaction which is triggered by absorption of actinic radiation. The term "actinic radiation" as used herein includes, but is not limited to, visible light, ultraviolet radiation, and infrared radiation. Enhanced speed of polymerization results in improved film speed. An autooxidizer consumes oxygen which inhibits the speedy propagation of chains in a free radical addition polymerization process.

More specifically, the film speed at which there is detectable change in the hardness of the composition (that is, the shoulder speed in a positive working composition) is a product of the quantum efficiency whit which the photoinitiator system generates free radicals and the quantum efficiency with which the incipient radicals react with oxygen. To maximize film speed, both efficiencies must be maximized.

It is well known that molecular oxygen strongly inhibits the radial initiated polymerization of acrylate monomers which typically display a 'lag' (induction time) prior to the onset of polymerization. Kinetic measurements have shown that during the induction time, the concentration of oxygen in acrylate monomer declines due to oxidative reactions, and no detectable polymerization begins until the concentration of oxygen is reduced to a few tenths of a percent of the equilibrium value. Thus, the photographic sensitivity of acrylate photopolymerization systems is governed in large part by this photooxidation process.

We know of nothing in the prior art that implies that there may be some rational, logical basis for choosing an autooxidizer which will provide any desired film speed. It is known however, that dyestuff/redox photohardenable compositions are peculiarly sensitive to the choice of autooxidizer, and that with an ionic dye/reactive counter ion complex, and specifically a cationic dye/borate anion complex, N, N-dialkylanilines function as effective autooxidizers. This has been disclosed in U.S. Pat. Nos. 4,772,530; 4,842,980 (class 430/subclass 138) and 4,772,541 (class 430/subclass 339) to Gottschalk et al. The photographic process based on the photopolymerization of acrylate monomers is described in U.S. Pat. Nos. 4,399,209 and 4,842,981 (class 430/subclass 138) to Sanders et al; and, in U.S. Pat. No. 4,840,866 (class 430/subclass 138) to Kovacs et al. The disclosures of each of the foregoing patents, all of which are commonly assigned to The Mead Corporation, are incorporated by reference thereto as if fully set forth herein.

In the photographic process described in the '209 and '836 patents, the photosensitive monomer composition is encapsulated with a photoinitiator and an image-forming agent. Exposure of the imaging sheet hardens the internal phase of the microcapsules and renders them resistant to physical rupture. Thus, a latent image is formed as an image-wise pattern of hard (exposed) and soft (not exposed) microcapsules. The visible image is developed physically by bringing the exposed capsule sheet into contact with a receiver sheet under pressure. Only the soft capsules rupture and deliver the image-forming agent, dissolved in the monomer, to the receiver sheet. The result is a direct positive of the original image. It has been shown that the exposure required to produce the first detectable loss in image density in the microencapsulated acrylate system is a function of the efficiency of photo-oxidation.

Several prior art references disclose that disulfides are effective autooxidizers, but they disclose particular disulfides which presumably are effective enough in their systems, but have proven to be far from adequately effective in an ionic dye/reactive counter ion system. We attribute the effectiveness of our disulfides to a unique "fingerprint" linkage which has the structure.

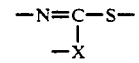

wherein X is S or O except for a specific case as discussed below. The fingerprint linkage is part of an aromatic ring with the sulfide S atom being exocyclic. This "fingerprint" linkage must be present in at least one of the two sulfide radicals which are directly single-bonded in the disulfides found effective in our photosensitive composition. In a specific case, as mentioned above, where one or both sulfide radicals are derived from 2-mercapto-tertrazole, the X in the fingerprint linkage is N. Typically, the disulfide linkage in our novel compounds directly connects aromatic groups in first and second sulfide radicals, and the aromatic groups in the sulfide radicals are generally different, but may be the same. Though certain of the novel disulfides in which the electron-withdrawing effect of the —S—S— connected aromatic rings is attenuated by a methylene group in each sulfide radical, are photoinitiators in unencapsulated photosensitive compositions, they are not effective in our photoinitiator system.

Implicit acknowledgement that the linkage to the exocyclic S atoms is critical, is found in U.S. Pat. No. 4,304,841 to Horn et al (Class 430/subclass 286) which disclosures disulfides having a —CH$_2$—S—S—CH$_2$— linkage which is calculated to attenuate the electron-withdrawing effect even of aromatic rings. Such disulfides are used in a photopolymerizable mixture which contains a polymeric binder, a compound which is polymerizable by free radical mechanism, and a photoinitiator. The disulfides are represented by the formula

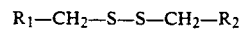

wherein $R_1$ and $R_2$ are identical or different and are alkyl, cycloalkyl, aryl, aralkyl or N-substituted carbamoyl or carbamoylalkyl groups. The initiators used are acridine, phenazine, quinoxaline, quinazolline, benzalquinaldine and thiopyrylium.

The general notion that an aromatic disulfide, that is, one in which the disulfide linkage connects aromatic radicals, was a useful co-initiator in a free radical polymerization was disclosed by Richards in U.S. Pat. No. 2,460,105 (Class 204/subclass 162) more than four decades ago. His primary source of free radical initiation was ultraviolet light generated by a 100 watt mercury lamp over more than 24 hr at a temperature above room temperature. He also disclosed that alkyl disulfides, cycloalkyl disulfides, acyl disulfides and thiuram disulfides displayed the activity he sought. This activity was characterized by the ability to polymerize styrene irradiated with the mercury lamp.

Two decades later, Rudolph et al, in U.S. Pat. No. 3,450,612 (Class 204-subclass 159.15), disclosed the use of aromatic disulfides in combination with peroxides as coinitiators for a free radical polymerization. A decade after Rudolph et al, Donald et al in U.S. Pat. No. 4,168,981 (Class 96/sublcass 115 P) disclosed that bis(-substituted amino)polysulfides were useful coinitiators.

None of the prior art disulfides disclosed are directly single-bonded sulfide radicals each of which has the unique fingerprint linkage of our invention which must be present as part of an aromatic ring having 5 or 6 ring members. The ring may be fused to another, with the sulfide S atom being exocyclic, provided that the aromatic ring in each radical is not tetrazole. By "aromatic" we refer to a pi-bonded ring system containing $4n+2$ pi electrons where n is 1 or 2.

Despite the commercial success of the ionic dye/reactive counter ion initiator in a photosensitive composition, and particularly one used as an internal phase of microcapsules, using an autooxidizer which attacks the acidic cationic dye/borate anion initiator decreases the shelf life of photosensitive material in which the system is used.

In particular, Japanese provision publication Tokkaisho 64-13144 to Yamaguchi et al (laid open Jan. 18, '89) discloses the use of thiols some of which have the fingerprint ring structure and bis-compounds of the thiols. In the disclosed bis-thiols, the connecting bridge is alkylene, and such bis-thiols are not disulfides. The aromatic thiols with the fingerprint structure have been found to be highly effective to improve speed with a cation dye/borate anion complex, but Yamaguchi et al fail to indicate that the complex is sensitive to, and deleteriously affected by the acidic portion in the thiols. The portion attacks the carbon-boron bond and the complex dissociates. The destruction of the borate ion causes a corresponding reduction in the amount of photoinitiator present. Thus the "shelf-life" of the photo sensitive composition is reduced.

Shelf-life, typically, is not a consideration in photosensitive compositions for planography plates, resin relief printing plates and resists or photomasks for making printed circuit boards, but shelf-life is an overriding consideration for a donor sheet or cartridge stock in a color photocopier, or in other comparable applications where preservation of the complex is essential. Nor does the reference intimate that their thiols and bis-thiols would exhibit much greater sensitivity after they are encapsulated than before, as do our disulfides. Further, the Yamaguchi et al compounds relate both to monoaza and diaza thiols in which the substitution of a C atom or a N atom respectively, to replace S or O in the aromatic ring of the thiol, have a known different electron withdrawing effect on the —SH group. When they couple thiols, they require a spacer between the coupled S atoms.

Accordingly, there exists a need in the art for an autooxidizer which (i) does not decrease the shelf life of film in which the autooxidizer is used, and (ii) may be used in a photosensitive composition which includes an ionic dye/reactive counter ion photoinitiator system, and more particularly to a microencapsulated photosensitive composition which is particularly sensitive to light in the visible wavelength range.

SUMMARY OF THE INVENTION

It has been discovered that a particular microencapsulated photohardenable composition has highly desirable film speed and shelf life, if microcapsules contain an internal phase with at least one of the foregoing disulfides in it, optionally in combination with a N,N-dialkylaniline. Such a composition comprises a free radical addition polymerizable or crosslinkable compound, an ionic dye/reactive counter ion complex capable of absorbing actinic radiation and producing free radicals which initiate free radical polymerization or crosslinking of said polymerizable or crosslinking compound, and an aromatic disulfide which functions at least in part as an autooxidizer capable of consuming oxygen in a free radical chain propagation. Such an autooxidizer consists essentially of a disulfide containing single-bonded first and second sulfide radicals, the first derived from an aromatic compound containing the fingerprint linkage. Where the first sulfide radical is not a tetrazole radical, the disulfide is represented by the structure

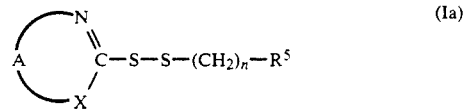
(Ia)

wherein n is 0 or 1; X is selected from the group consisting of S and O; A represents the residue of the ring containing the N, C and X atoms, the ring containing five or six members in which the ring may be fused to another atomic ring; —S—$(CH_2)_n$—$R^5$ represents said second sulfide radical in which $R^5$ is derived from an aromatic radical selected from the group consisting of (i) phenyl, (ii) benzothiazole, (iii) benzoxazole, (iv) tetrazole, (v) pyridine, (vi) pyrimidine, (vii) thiazole, (viii) oxazole, (ix) quinazoline, and (x) thiadiazole, each of which may have a substituent on one or more C or N atoms of the ring; and when n=O, —S—$R^5$ is said second sulfide radical which may be the same as said first sulfide radical, or a different sulfide radical.

In the compound (Ia) when n=O, the structure is

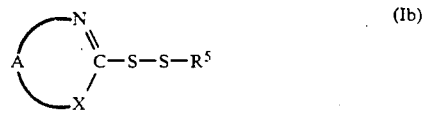
(Ib)

and in the particular instance wherein $R^5$ is phenyl, or phenyl substituted with a substituent on one or more carbon atoms of the ring, $R^5$ may be mono- or dihalophenyl; $C_1-C_{20}$ alkoxyphenyl, for example phenyl substituted with $C_1-C_{20}$ alkoxy, the phenyl substituted to the S; or $C_1-C_{20}$ alkylphenyl, for example phenyl substituted with $C_1-C_{20}$ alkyl, the phenyl connected to the S atom.

In addition to the foregoing, where the disulfide contains first and second aromatic radicals said first aromatic radical being a tetrazole ring, the disulfide may be represented by the structure

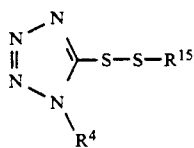

wherein, $R^{15}$ represents an aromatic radical the same or different from the tetrazole radical; and $R^4$ represents $C_1-C_{20}$ alkyl, $C_5-C_{20}$ cycloalkyl, $C_7-C_{20}$ aralkyl, phenyl, naphthyl, mono- or dihalogenated phenyl or naphthyl, or phenyl or naphthyl having $C_2-C_{20}$ dialkylamino substituent.

It is therefore a general object of this invention to provide a microencapsulated, photohardenable composition having desirable film speed and shelf life, in which composition a disulfide having the foregoing general structure is incorporated prior to its encapsulation.

It is also a general object of this invention to provide a novel disulfide, generally effective in photosensitive compositions, the disulfide having at least one sulfide radical containing an aromatic ring with the fingerprint linkage, being selected from the group consisting of

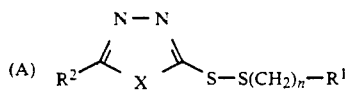

wherein n is 0 or 1; X represents S or O; $R^2$ is selected from the group consisting of $R^1-S-C_1-C_{20}$ alkylthio, $C_1-C_{20}$ alkyl, $C_5-C_{12}$ cycloalkyl, —SH and H; and $R^1$ represents an aromatic radical having 5 or 6 ring members; and, in addition may be fused to an aromatic ring; and, said first and second sulfide radicals may be the same or different; and

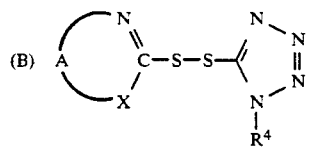

wherein, $R^4$ represents $C_1-C_{20}$ alkyl, $C_5-C_{20}$ cycloalkyl, $C_7-C_{20}$ aralkyl, phenyl, naphthyl, mono- or dihalogenated phenyl or naphthyl, and phenyl or naphthyl having a $C_2-C_{20}$ dialkylamino subsitutent, and An and K are defined as in formula (Ia) above.

It has also been discovered that only some of the disulfides in the foregoing group may be formulated for encapsulation as a photopolymerizable composition (an internal phase) which quite unexpectedly exhibits greater sensitivity after it is encapsulated, than it does when not encapsulated. The microcapsules are deposited as a thin layer from about 1 micron to about 100 microns thick, on a laminar substrate. Such disulfides are particularly effective co-initiators for a photoinitiator system sensitive to actinic radiation, and more specifically to actinic radiation in the visible wavelength range. In such a system, each disulfide functions at least in part as an autooxidizer. Specific such disulfides are those having the structure (I) wherein $R^5$ in the second sulfide radical is derived from an aromatic radical selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring.

A specific compound having one of the foregoing second sulfide radicals, and a first radical selected from either a thiazole or a benzothiazole is represented by a structure selected from the group consisting of

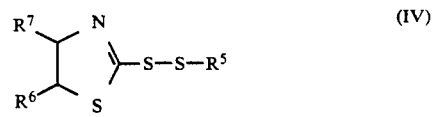

wherein $R^6$ and $R^7$ independently represent H, $C_1-C_{20}$ alkyl, $C_7-C_{20}$ aralkyl, phenyl and when together cyclized represent a fused aromatic ring which may be substituted; and,

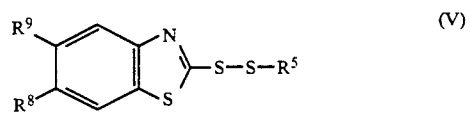

wherein $R^8$ and $R^9$ are independently selected from the group consisting of H, $C_1-C_{20}$ alkoxy, $C_1-C_{20}$ alkyl, phenyl, naphthyl, and phenoxy.

It is therefore a general object of this invention to provide aromatic disulfides having the foregoing structures, in a photosensitive composition, preferably one which is photohardenable when exposed to actinic radiation, especially visible light having an intensity of less than 1 Joule/cm² for a period less than 1 minute.

It is a specific object of this invention to provide a photosensitive material on which is deposited a thin layer of microcapsules having an internal phase formulated with the addition of an aromatic disulfide having one of the foregoing structures.

It is another specific object of the present invention to produce a substrate on which is deposited a thin layer of microcapsules encapsulating a photosensitive composition wherein either the first or second disulfides exhibits speed enhancement in both the autooxidation and the photopolymerization reactions.

These and other objects will be more readily understood and appreciated by one skilled in the art with reference to the following detailed description of the preferred embodiments.

DETAILED DESCRIPTION OF PREFERRED EMBODIMENTS

A preferred photosensitive composition includes less than 10 parts by weight (wt), preferably from about 0.5 to 5 parts by wt of a disulfide having the general structure (I) hereinabove, and more particularly having either structure (II) or (III), homogeneously dispersed in a mixture containing an absorber which is an ionic dye/reactive counter ion complex able to absorb actinic radiation and directly or indirectly generate free radicals upon exposure thereto, preferably to visible light in the wavelength range from about 4000 A to about 7000 A. The extent to which the disulfide may react with another component of the photosensitive composition, or, be complexed with, or otherwise associated with another component, is not known, and will vary from one disulfide to another, particularly if the composition is present as the internal phase of a microcapsule. However, the internal phase containing the disulfide is added to an aqueous mixture which is emulsified, and the emulsion may be used, per se, to coat a substrate, or the emulsion may be used to generate discrete, walled microcapsules, the latter being most preferred. The mean microcapsule diameter is in the range from about 1 to 25 microns.

The microcapsules may be produced using any known encapsulation technique such as coacervation, interfacial polymerization, polymerization of one or more monomers in an oil, etc. Suitable wall formers are known in the art and are referred to in U.S. Pat. No. 4,840,866 to Kovacs et al.

In a preferred manner of forming the microcapsules, a monomer (say, trimethylolpropane triacylate, TMPTA) is mixed with a Cyan color forming agent (Hilton Davis HD-5430), and a cationic dye/borate anion complex (say, 1,1'-dihexyl-3,3,3',3'-tetramethylindodicarbocyanine triphenyl-n-butyl borate) to form a "monomer mixture". The disulfide may be dissolved directly in the monomer mixture, or, if desired, premixed with an additional amount of monomer, optionally in the presence of a mutual solvent, and is incorporated into the monomer mixture. In a separate vessel, an aqueous mixture is prepared with appropriate thickening agents, and the pH of the aqueous mixture is adjusted to a suitable level. To this aqueous mixture is added the monomer mixture while both are mixed with a turbine impeller so that emulsification occurs. During emulsification, the mixture is heated and an aqueous solution of urea, formaldehyde (37%) and resorcinol with ammonium sulfate is added at intervals to encapsulate the internal phase. Heating is continued until the desired wall thickness is obtained, and after curing, the pH is adjusted to about pH 9 using a 20% NaOH solution. Dry sodium bisulfite is added and the dispersion of microcapsules cooled to room temperature. A more detailed description is found in U.S. Pat. No. 4,842,980 to Gottschalk et al. If desired, the walls may be made with melamine instead of urea.

The effect of the disulfide on sensitivity is measured both before and after encapsulation of the photohardenable composition using a "slide test" or a "gel test" for the unencapsulated composition or internal phase, as a screen to determine if there is any significant activity, and, thereafter with a standard "step-wedge test" for a thin layer of microcapsules deposited on a substrate ("media sensitivity"). A detailed description of the preparation of a photosensitive substrate is found in U.S. Pat. No. 4,842,981 to Gottschalk et al.

THE "GEL" TEST

This test is a comparative test to determine the effectiveness of a co-initiator. The test is conducted with a fixed intensity, standard tungsten broad spectrum light source. A small sample of a control monomer mixture (about 1 to 5 mg) typically consisting of liquid monomer and a known, effective photoinitiator in an amount sufficient to provide a gel time in the range from about 1 sec to about 1 min with the selected light source, is trapped between microscope slides to provide a sandwich of a thin film about 2 to 5 microns thin. The sandwich with the control solution is exposed to the light source for a preselected period of time. Gel formation is determined visually by inspecting a series of dissembled slides exposed by varying periods, to determine at which time the "standard" gel formation, judged from experience, occurs. In an analogous manner, several sandwiches of slides between which are trapped monomer mixtures containing a co-initiator to be evaluated, are exposed to the light source for varying periods of time. The improvement in photospeed is determined by the decrease in time to gel. A correlation may be made with standard step-wedge data generated with a known system.

THE "SLIDE TEST"

This test, like the gel test is a comparative non-visual test conducted with the same, or a similar, fixed intensity light source. From one to three drops of monomer mixed with initiators are placed on a glass slide and another slide placed over the mixture. The slides are held a preselected distance from the source, the distance chosen to gel the mixture within a short period of from about 1 sec to about 1 min. The slides are manually moved back and forth, slowly, keeping the mixture sandwiched therebetween, until a distinct resistance is felt.

The specific method for measuring sensitivity is not narrowly critical provided it furnishes a reproducible comparison of relative sensitivities.

The "step-wedge" test is conducted by making a graded series of exposures on a light sensitive material coated with a thin layer of microcapsules containing the photohardenable composition as the internal phase. A factor of 2 is referred to as a "stop". Increasing the density of a step wedge by 0.3 reduces exposure by a factor of 2; conversely, decreasing the density of a step wedge by 0.3 increases exposure by a factor of 2. A "D - logH" (also known as an "H-D") curve is generated by photoexposing through a step-wedge and developing donor on receiver. The resulting densities of images are measured and plotted as Density vs. log H (Energy of exposure, ergs/cm$^2$. A standard 30 step Stouffer gelatin step-wedge is used in which 3 steps correspond to a factor of two in photospeed. Adjacent steps are different by 0.1 density units. Sensitometric results were obtained for microcapsules containing the disulfides identified in the following Table I. The internal phase composition in each case is as follows:

150 g TMPTA 1.2 g 1,1'-dihexyl-3,3,3',3'-tetramethylindodicarbocyanine triphenyl-n-butyl borate 15 g Cyan color forming agent Hilton Davis HD-5430 and 1.5 g DIDMA The capsules were mixed with binder, surfactant, and water to provide a dispersion of 18% solids which were coated on an aluminized base at 6 g/M$^2$ and exposed through a step wedge (3 steps per stop) to a tungsten white light source. Sensitivity values which are averaged for each test, are expressed in log energy units (ergs/cm$^2$).

TABLE 1

| Compound* | E90 | E10 | Aging |
|---|---|---|---|
| none | 2.88 | 3.47 | 1.5 |

TABLE 1-continued

| Compound* | E90 | E10 | Aging |
|---|---|---|---|
| 1a | 2.36 | 2.68 | 4.5 |
| 1b | 2.38 | 2.72 | |
| 1c | 2.42 | 2.76 | 4.0 |
| 1d | 2.50 | 2.82 | 2.0 |
| 1e | 2.46 | 2.81 | 3.5 |
| 1f | 2.68 | 3.17 | 4.8 |
| 1g | 2.27 | 2.62 | |
| 2f | 2.53 | 2.82 | |
| 6a | 2.30 | 2.58 | |
| 6b | 2.26 | 2.79 | 11.6 |
| 6d | 2.57 | 2.91 | |
| 1m' | 2.22 | 2.50 | 9.0 |
| 1' | 2.31 | 2.61 | 3.5 |
| 2' | 2.42 | 2.75 | 2.5 |
| 2c' | 2 30 | 2.79 | 7.5 |
| 1g' | 2.51 | 2.95 | 3.0 |

*the compounds identified by code are identified by structure and named accordingly, herebelow.
measured as steps lost after 10 days at 60 'C.

Disulfides used in the present invention may be conventionally synthesized by subjecting a thiol starting material to an oxidative coupling reaction. Examples of such syntheses are set forth in Yoneda et al., "A New Hydrogen-Abstracting Reaction with Diethyl Azodicarboxylate", *Journal of the American Chemical Society*, 88:10, 1966; Mukaiyama et al., "A Convenient Method for the Preparation of Unsymmetrical Disulfides by the Use of Diethyl Azodicarboxylate", *Tetrahedron Letters*, 56, pp. 5907–5908, 1968. The coupling reaction can take place by the reaction of the thiol starting material with a strong electron accepting agent. Diethyl azodicarboxylate is a preferred electron accepting agent.

Disulfides having the foregoing structure (II) are also conventionally prepared from substituted 2-mercaptobenzothiazoles, as for example described in "Synthesis of Derivatives of 4,5-dimethl-2-mercaptothiazole" by Floyd D. Stewart and Roger A. Mathes, *J. Org. Chem*, 14, (1949). The appropriate 2-mercaptobenzothiazole derivative provides a first aromatic sulfide radical which is single-bonded with a desired sulfenyl halide which is also conventionally prepared, for example, as described in syntheses disclosed in "One Hundred Years of Sulfenic Acid Chemistry IIb. Substitution and Cyclization of Sulfenyl Halides, by Englebert Kuhle, *Synthesis* (1970). The sulfenyl chloride provides the second aromatic sulfide radical.

For example, when the second sulfide radical is the same as the first, the structures of illustrative disulfides are as follows:

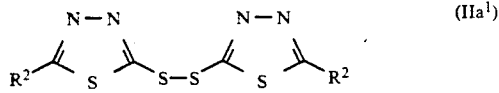

(IIa¹)

which is prepared from the appropriately substituted 2-mercapto-thiadiazole; and,

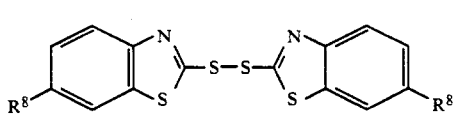

which is prepared from the appropriately substituted 2-mercapto-benzothiazole, for example, $R^8$ being ethoxy.

Disulfides having structure (II) in which a first sulfide radical having a substituted thiadiazole groups is connected to a second sulfide radical different from the first, is illustrated by 4-chlorophenyl 5-heptylthio-1,3,4-thiadiazol-2-yl disulfide; and a benzothiazolyl group may be used instead of the chlorophenyl group.

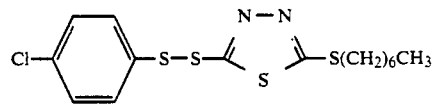

Disulfides having structure (V) in which the benzothiazolyl group in the first sulfide radical has no substituents, and the second sulfide radical is different from the first, are illustrated by the following compounds (identified hereinbelow, and coded with a combination of number and letter):

2a benzothiazol-2-yl phenyl disulfide

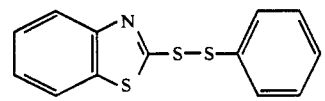

2b benzothiazol-2-yl 4-methylphenyl disulfide

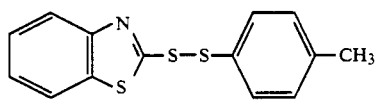

2c benzothiazol-2-yl benzoxazol-2-yl disulfide

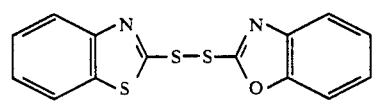

2d benzothiazol-2-yl 4,6-dimethylpyrimidin-2-yl disulfide

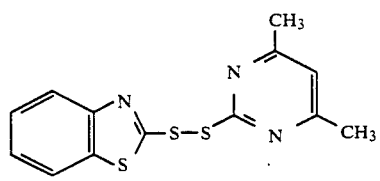

2e benzothiazol-2-yl 5-heptylthio-1,3,4-thiadiazol-2-yl disulfide

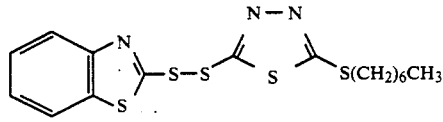

2f benzothiazol-2-yl 4-chlorophenyl disulfide

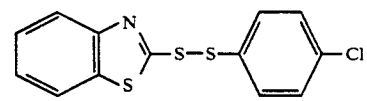

Disulfides having structure (V) in which the first sulfide radical is derived from 6-ethoxy-2-mercaptobenzothiaozole, and the second sulfide radical is different from the first, are illustrated by the following compounds (identified hereinbelow, and coded with a combination of number and letter):

1a 4-chlorophenyl 6-ethoxybenzothiazol-2-yl disulfide

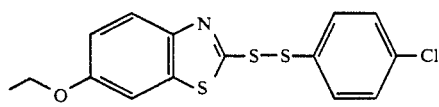

1b 6-ethoxybenzothiazol-2-yl phenyl disulfide

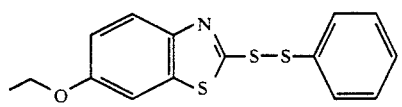

1c 4-dodecyloxyphenyl 6-ethoxybenzothiazol-2-yl disulfide

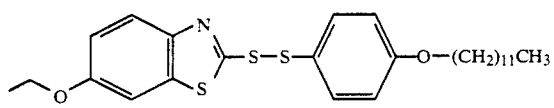

1d 6-ethoxybenzothiazol-2-yl 4-methylphenyl disulfide

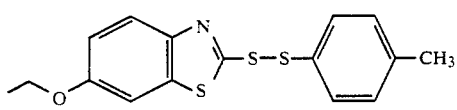

1e 6-ethoxybenzothiazol-2-yl 4-methoxybenzyl disulfide

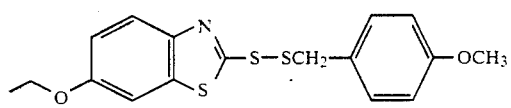

1f benzyl 6-ethoxybenzothiazol-2-yl disulfide

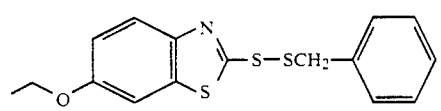

1g 6-ethoxybenzothiazol-2-yl 1-phenyltetrazol-5-yl disulfide

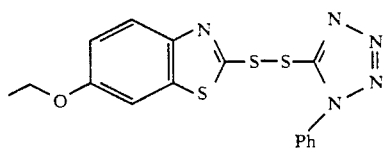

1h 6-ethoxybenzothiazol-2-yl pyridin-2-yl disulfide

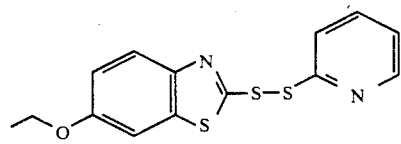

1i 4,6-dimethylpyrimidin-2-yl 6-ethoxybenzothiazol-2-yl disulfide

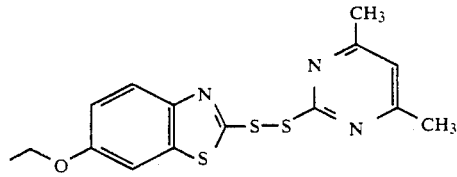

1j 6-ethoxybenzothiazol-2-yl pyrimidin-2-yl disulfide

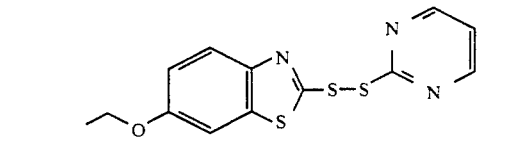

1k 2-dimethylaminophenyl 6-ethoxybenzothiazol-2-yl disulfide

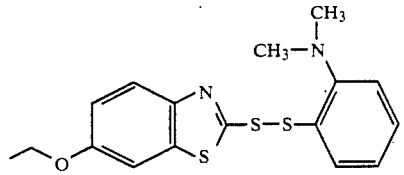

1l 4-dimethylaminophenyl 6-ethoxybenzothiazol-2-yl disulfide

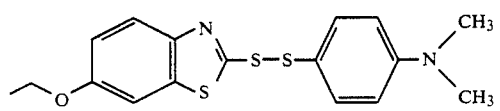

1m 6-ethoxybenzothiazol-2-yl 5-heptylthio-1,3,4-thiadiazol-2-yl disulfide

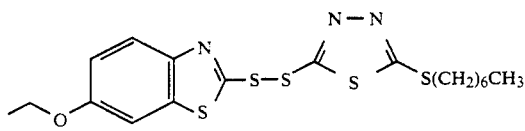

1n 6-ethoxybenzothiazol-2-yl 4-phenylthiazol-2-yl disulfide

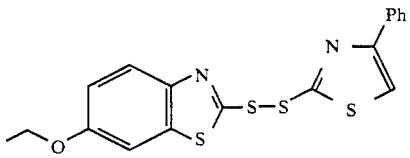

1o 6-ethoxybenzothiazol-2-yl 1-(4-methylphenyl)tetrazol-5-yl disulfide

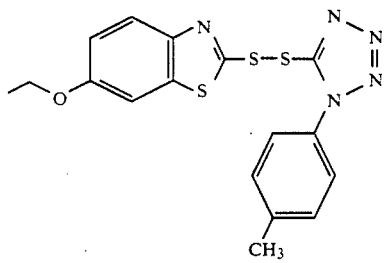

1p 6-ethoxybenzothiazol-2-yl 1-(4-dimethylaminophenyl)tetrazol-5-yl disulfide

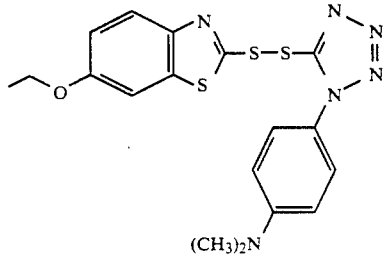

1q 1-cyclohexyltetrazol-5-yl 6-ethoxybenzothiazol-2-yl disulfide

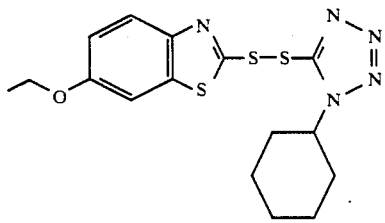

1r 6-ethoxybenzothiazol-2-yl 1-methyltetrazol-5-yl disulfide

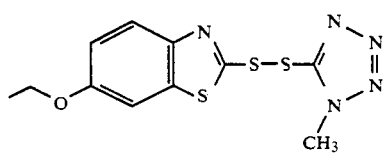

6a 4-chlorophenyl 5-heptylthio-1,3,4-thiadiazol-2-yl disulfide

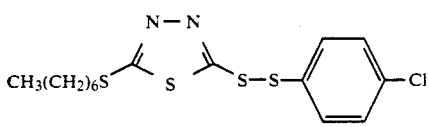

6b 4-chlorophenyl 1-phenyltetrazol-5-yl disulfide

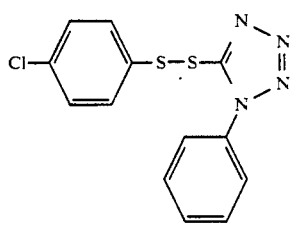

6d benzoxazol-2-yl 4-chlorophenyl disulfide

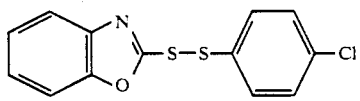

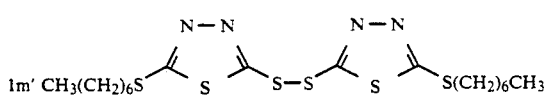

1m'

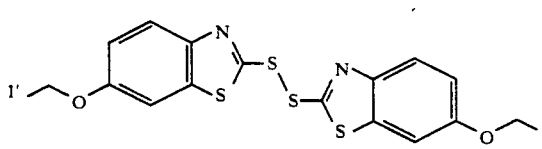

1'

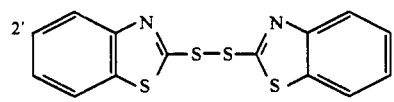

2'

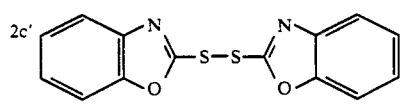

2c'

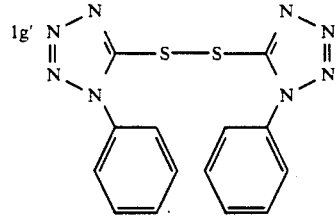

1g'

Particularly preferred are the disulfides of 2-mercaptobenzoxazole (MBO), 6-ethoxy-2-mercaptobenzothiazole (EMBT) and substituted mercaptotetrazole.

In addition to the disulfide autooxidizer, the photoinitiator compositions of the present invention include an absorber, which either is a compound which absorbs actinic radiation and generates a free radical, or, is compound which absorbs radiation and reacts with a coinitiator to generate a free radical, the absorption depending upon the spectral sensitivity of the compound.

Absorbers useful in the present invention include compounds conventionally used, or known in the art to be useful, as absorbers. These include (i) the ionic dye complexes, particularly the cationic dye-borate compounds; (ii) aryl benzophenones such as 4,4'-dimethoxybenzophenone, 4,4'-dichlorobenzophenone, 4,4'-bis(dimethylamino) benzophenone, benzanthone, 9-fluorenone; (iii) xanthones such as, xanthone, 2-methylxanthone, 2-dodecylxanthone, etc.; (iv) thioxanthones such as thioxanthone, 2-methylthioxanthone, 2-dodecylthioxanthone, 2-chlorothioxanthone, 2-isopropylthioxanthone, etc.; (v) ketocoumarins such as 3-cinnamoyl-7-diethylaminocoumarin; (vi) quinones such as phenanthrenequinones; and (vii) compounds such as 2-methyl-1-[4-(methylthio)phenyl]-2-morpholinopropanone-1.

Preferred among these absorbers are thioxanthones, phenanthraquinones, the morpholino compounds, and ketocoumarins. (Examples of ketocoumarins useful in the present invention are disclosed in U.S. Pat. No. 4,713,312 to Adair et al.)

Particularly preferred absorbers for the photosensitive material of this invention are the ionic dye complexes. These complexes are stable, non-transient compounds as opposed to the transient collision generated encounter complexes, exciplexes or contact ion pairs which may be encountered in some photohardenable compositions. Examples of ionic dye complexes useful in the present invention are provided in U.S. Pat. No. 4,772,541.

A particularly useful ionic dye complex is one of the cationic dye-borate compounds represented by the formula

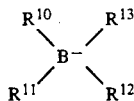

where D+ is a cationic dye; and $R^{10}$, $R^{11}$, $R^{12}$, and $R^{13}$ are independently selected from the group consisting of alkyl, aryl, alkaryl, allyl, aralkyl, alkenyl, alkynyl, alicyclic and saturated or unsaturated heterocyclic groups.

Useful dyes form photoreducible, but dark stable, complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes. In addition to being cationic, the dyes should not contain groups which would neutralize or densensitize the complex or render the complex poorly dark stable.

Specific examples of useful cationic dyes of Formula II are Methylene Blue, Safranine O, Malachite Green, cyanine dyes of the general formula (III) and rhodamine dyes of the formula (IV):

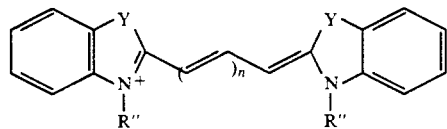
(III)

n = 0, 1, 2, 3,
R'' = alkyl
Y = CH=CH, N—CH$_3$, C(CH$_3$)$_2$, O, S, Se;

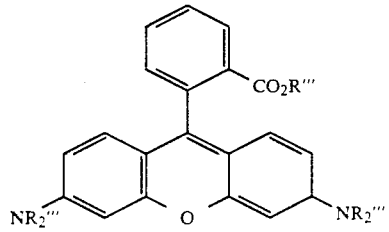
(IV)

R''', R2''' = alkyl, aryl, and any combination thereof

The borate anion of Formula II is selected such that the boranyl radical generated upon exposure to light and after electron transfer to the dye readily dissociates with the formation of a radical as follows:

For example, particularly preferred anions are triphenyl-butylborate triphenylbenzylborate, triphenylsectuylborate, triphenylneopentylborate, and trianisylbutylborate because they readily dissociate to a triarylborane and an alkyl or aralkyl radical. On the other hand, tetrabutylborate anion does not work well possibly because the tetrabutylborate radical is not stable and it readily accepts an electron back from the dye in a back electron transfer and does not dissociate efficiently. Likewise, tetraphenylborate anion is very poor because the phenyl radical is not easily formed.

Preferably, at least one but not more than three of $R^{10}$, $R^{11}$, $R^{12}$, and $R^{13}$ is an alkyl group. Each of $R^{10}$, $R^{11}$, $R^{12}$, and $R^{13}$ can contain up to 20 carbon atoms, and they typically contain 1 to 10 carbon atoms. More preferably $R^{10}$-$R^{13}$ are a combination of alkyl group(s) and aryl group(s) or aralkyl group(s) and still more preferably a combination of three aryl groups and one alkyl or aralkyl group.

Specific examples of cationic dye-borate anion compounds useful in the present invention are shown in U.S. Pat. No. 4,772,541.

The cationic dye-borate anion compounds can be prepared by reacting a borate salt with a dye in a counter ion exchange in a known manner. See Hishiki, Y., *Repts. Sci. Research Inst.* (1953), 29, pp 72-79. Useful borate slats are sodium or magnesium salts such as sodium or magnesium triphenylbutylborate, sodium or magnesium trianisylbutylborate and ammonium salts such as tetraethylammonium triphenylbutylborate.

Anionic dye compounds are also useful as absorbers in the present invention. Anionic dye-iodonium ion compounds of the formula (V):

(V)

where D- is an anionic dye and $R^{14}$ and $R^{15}$ are independently selected from the group consisting of aromatic nuclei such as phenyl or naphthyl and n is 1 or 2; and anionic dye-pyryllium compounds of the formula (VI):

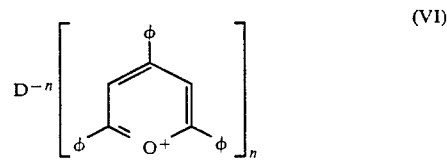
(VI)

where D- and n are as defined above are typical examples of anionic dye complexes.

Representative examples of anionic dyes include xanthene and oxonol dyes. For example rose Bengal, eosin, erythrosin, and fluorscein dyes are useful. In addition to iodonium and pyryllium ions, other compounds of anionic dyes and sulfonium and phosphonium cations are potentially useful.

Selected examples of anionic dye compounds are shown in U.S. Pat. No. 4,772,530.

In addition to the foregoing compounds it may also be desirable to include an N,N-dialkylaniline compound in the photoinitiator composition as a co-initiator or as co-oxidant (depending upon the nature of the dialkylaniline).

Representative examples of N,N-dialkylanilines useful as co-initiators or autooxidizers in the recent invention are represented by the formula (VII)

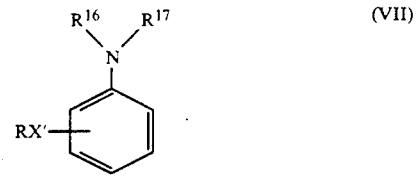
(VII)

where $R^{16}$ and $R^{17}$ are alkyl groups having 1 to 6 carbon atoms and preferably 1 to 4 σ carbon atoms, n is an integer of 1 to 5, and X' is a substituent having a Hammett's (para) constant sigma (σ) in the range of −0.9 to 0.7. Preferred X' have a Hammett's constant in the range of −0.5 to 0.5 and still more preferred X' have a constant in the range of −0.2 to 0.5. Representative examples of X' are a hydrogen atom, a cyano group, a halogen atom (e.g., fluorine, chlorine, or bromine), an alkyl group having 1 to 3 carbon atoms, a hydroxyl group, an alkoxy group having 1 to 3 carbon atoms (e.g., ethoxy), an amino group, a dialkylamino group wherein the alkyl groups have 1 to 3 carbon atoms, an acyl group having 2 to 6 carbon atoms (e.g., acetyl) an acylamido group having 2 to 6 carbon atoms (e.g., acetylamido), an alkylsulfido group having 2 to 4 carbon atoms (e.g., −SCH$_3$), a phenyl group, a hydroxy group, a mercapto group, etc. When n is 2 or 3, the X' groups can be the same or different. The position of the X' substituent(s) affects the ability of the aniline to effect net hydrogen transfer.

Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N, N,N-dimethylaniline, 3-ethoxy-N,N-dimethylaniline, 4fluoro-N,N-dimethylaniline, 4-methyl-N,N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N', N'-tetramethyl-1,4-dianiline, 4-acetamido-N,N-dimethylaniline, etc.

Examples of more preferred N,N-dimethylanilines are dialky- lanilines substituted in the ortho-, meta- or para-position by the following groups: methyl ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstanyl, triethylstannyl, n-butoxy, n-pentyloxy, phenoxy, hydroxy, acetyloxy, methylthio, ethylthio, isopropyl- thio, thio-(mercapto-), acethylthio, fluoro, chloro, bromo and iodo.

Examples of N,N-dialkylanilines useful as co-initiators are ethyl-p-(dimethylamino)benzoate (EPD), 2-n-butoxyethyl-4-(dimethylamino)-benzoate, and ethyl o-(dimethylamino)-benzoate. N,N-dialkylanilines substituted with one or two alkyl groups in the ortho-position are often good autooxidizers. Examples of N,N-dialkylanilines typically useful as co-oxidants are 2,6-diisopropyl-N,N-dimethylaniline, 2,6-diethyl-N,N-dimethylaniline, N,N,2,4,6-pentamethylaniline and p-t-butyl-N,N-dimethylaniline.

It has been discovered that the disulfides of Formula I act as particularly good autooxidizers when used in combination with cationic dye anionic borate absorbers and with N,N-dimethylanilines, and particularly with N,N-dimethylanilines substituted with one or two alkyl groups in the ortho-position. It had been proposed to use a thiol-aniline co-autooxidizer in association with the cationic dye-anionic borate absorber but a problem occurred by depletion of the borate anion at temperatures greater than 60° C. It is hypothesized that presence of the acidic hydrogen of the thiol group would undesirably react with the borate ion by attacking the carbon-boron bond. This depletes the amount of borate anion available to generate free radicals. As a result, the efficiency of the photoinitiator composition is significantly reduced. By using a disulfide compound instead of a simple thiol as an autooxidizer, the acidic hydrogen atom associated with the single thiol is eliminated. Accordingly, the disulfide compound does not attack the borate anion and as such, the amount of borate available to generate free radicals is not depleted. Thus, use of a disulfide compound as an autooxidizer can function to maximize the efficiency of the photoinitiator compound.

The photoinitiator composition is incorporated in the photohardenable composition in an amount sufficient to cause the composition to harden upon exposure to actinic radiation and more preferably in an amount sufficient to provide a low film speed. Typical compositions contain up to about 1 part of the absorber per 100 parts of the free radical polymerizable or crosslinkable compound and preferably about 0.5 to 1.5 parts per 100 parts of the free radical addition polymerizable or crosslinkable compound. The ratio will depend on the compounds selected, the extinction coefficients of the absorber, etc. as will be understood in the art.

Photoinitiator systems in accordance with the present invention may contain about 1.0 to 12% by weight of the disulfides based on the polymerizable monomer.

When present, the N,N-dialkylanilines are used in an amount of about 1.0 to 6% by weight based on polymerizable monomers and the disulfides are used in an amount of about 0.5 to 12% by weight based on the amount of monomer.

The photoinitiator composition in accordance with the present invention can be used in combination with substantially any free radical addition polymerizable material. The most typical examples of a free radical addition polymerizable or crosslinkable material useful in the present invention are ethylenically unsaturated compounds and, more specifically, polyethylenically unsaturated compounds. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropene triacrylate (TMPTA), pentaerythritol tetraacrylate, pentaerythritol tetramethyacrylate, dipentaerythritol hydroxypentacrylate (DPHPA), hexanediol-1,6-dimethyacrylate, and diethyleneglycol dimethacrylate.

While not desiring to be bound, use of disulfide compounds in association with photopolymerizable monomers is believed to provide more highly crosslinked and higher molecular weight polymers upon exposure of the monomers to actinic radiation. In prior art systems utilizing aniline or thiol autooxidizers, although the compounds have performed very well in their oxygen scavenging function, they tend to decrease the efficiency of the polymerization chemistry. It is hypothesized that when the anilines or thiols are used they function as a chain transfer agent. As a result, the molecular weight of the polymer produced is relatively low and exhibits reduced physical integrity. In embodiments where the polymer is encapsulated with an image-forming agent, the reduced integrity of the polymer may lead to softer capsules and cause unwanted image-forming agent to exude from the microcapsules upon the application of pressure. By comparison, when using a disulfide compound as an autooxidizer, it is believed a more highly crosslinked, higher molecular weight polymer results and concomitantly harder capsules are formed.

Photohardenable compositions in accordance with the present invention may be coated upon a support in a conventional manner and used as photoresist or in photolithography to form a polymer image or a resist image; or they may be encapsulated as described in U.S. Pat. No. 4,399,209 and used to control the release of an image-forming agent. In accordance with a preferred embodiment of the invention, the photohardenable composition is encapsulated with a color former and images are formed by reacting the color former with a color developer. Still more preferably, the compositions are used in full color panchromatic imaging systems employing microencapsulated acrylates.

The color formers which are useful in the aforementioned embodiment are colorless electron donating type compounds and are well known in the art. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI are often used. The color formers can be used alone or in combination. A particularly preferred color former is described in U.S. Pat. No. 4,600,678.

A further advantage associated with the present invention is the ease of encapsulation as a result of using the disulfide autooxidizer material. In prior art systems utilizing thiol materials as autooxidizers, encapsulation is complicated by the acidic hydrogen of the thiol. What typically has to be done to form microcapsules is to post-add the thiol by diffusion through the microcapsule wall. By comparison, in the present invention, the disulfide materials used as autooxidizers may be initially combined with the monomer, absorber and image-forming agent and dispersed in an aqueous medium, followed by the formation of microcapsule walls around the dispersed phase in an otherwise conventional manner.

The developer materials conventionally employed in carbonless paper technology are also useful in the present invention. Illustrative examples are clay minerals such as acid clay, active clay, attapulgite, etc.; organic acids such a tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert-butyl salicylate, zinc 3,5-di-(-methylbenzyl)salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

A particularly preferred developer is a finely divided thermoplastic phenolic resin which can be coalesced by heating after transfer of the color former as described in U.S. application Ser. No. 073,036 filed Jul. 14, 1987.

The invention is illustrated in more detail by the following non-limiting example:

As indicated in U.S. Pat. Nos. 4,399,209; 4,440,846 and 4,842,980, the developer may be present on a photosensitive sheet (providing a so-called self-contained system) or, on a separate developer sheet.

In self-contained systems, the developer may be provided in a single layer underlying the microcapsules as disclosed in U.S. Pat. No. 4,440,846. Alternatively, the color former and the color developer may be individually encapsulated in photosensitive capsules and upon exposure and subsequent image-wise rupture, there is a release of color former and developer which mix, resulting in formation of the image. Alternatively, the developer can be encapsulated in non-photosensitive capsules such that upon processing all developer capsules rupture and release developer but the color former containing capsules rupture in only the unexposed or under-exposed area which are the only areas where the color former and developer mix. Still another alternative is to encapsulate the developer in photosensitive capsules and the color former in non-photosensitive capsules.

Whatever conventional technique is used to produce a photosensitive material, the one we have produced comprises a support having a layer of photohardenable composition on its surface, the photohardenable composition comprising a free radical addition polymerizable or crosslinkable compound, and an ionic dye/reactive counter ion compound capable of absorbing actinic radiation and producing free radicals which initiate free radical polymerization or crosslinking of said polymerizable or crosslinkable compound, and, an aromatic disulfide containing a first sulfide radical derived from an aromatic compound containing at least one N atom attached to a ring C atom bonded to an exocyclic S atom, said disulfide represented by any one of the structures provided hereinabove.

EXAMPLE

The following photosensitive composition used as a control was prepared by mixing together the following compounds:

| | |
|---|---|
| Trimethlolpropane triacrylate | 150 g |
| 1,1′di-n-heptyl-3,3,3′,3′-tetramethyl-indodicarbocyanine triphenyl-n-butyl borate | 1.2 g |
| 2,6-diisopropyl-N-N-dimethyl aniline | 1.5 g |
| Cyan color forming agent (Hilton Davis HD-5430) | 18 g |

The composition was encapsulated in melamine formaldehyde microcapsules. The photographic properties of the control composition were measured by using a step wedge and the properties are shown in Table 1.

The disulfide of 6-ethoxy-2-mercaptobenzothiazole (EMBT-D) was prepared by reacting EMBT in the presence of diethyl

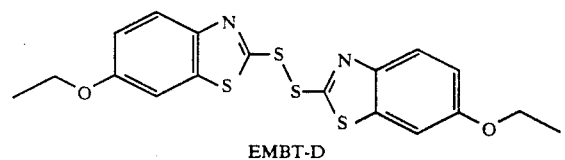

EMBT-D azodicarboxylate. 2 grams and 4 grams of the disulfide (EMBT-D) respectively were added to the control composition and the photographic properties of the resulting compositions are shown in Table 1. The compositions containing the disulfide compounds demonstrated improved sensitivity and were capable of producing highly contrasted images as demonstrated by the high gamma values.

TABLE 1

| Gamma | E90 | E10 | Dynamic Range |
|---|---|---|---|
| Control 3.62 | 3.44 | 4.01 | 0.57 |
| Control + 2 g EMBT-D 5.76 | 3.16 | 3.54 | 0.38 |
| Control + 4 g EMBT-D 5.36 | 3.12 | 3.54 | 0.40 |

Table 2 illustrates the difference in effectiveness of some of the disulfides when evaluated in the unencapsulated vs. encapsulated form.

Solutions were prepared in TMPTA with 0.2% by wt of photoinitiator (1,1'-di-n-heptyl-3,3,3',3'-tetramethylindodicarbocyanine triphenyl-n-butyl borate) and 1%, 2,5-diisopropyldimethylaniline. Disulfides were added to the control composition and photosensitivities of these solutions were measured via the gel or slide tests. These solutions were also encapsulated and the sensitivities were measured via the step-wedge test. The data is shown in Table 2.

TABLE 2

|  | | | Factor of improvement over control | |
|---|---|---|---|---|
|  | Unencapsulated | | | |
|  | Time to polymerization seconds | | | |
| Control | 19.8 | | | |
| 1' EMBT-D | 14.7 | | 1.3 | |
| 1b EBTP-D | 15.3 | | 1.3 | |
| 1d EBMP-D | 17.5 | | 1.1 | |
| 1c EBC12-D | 19.8 | | 1.0 | |
| 1a EBCP-D | 14.6 | | 1.4 | |
|  | Encapsulated | | | |
|  | E90 | E10 | E90 | E10 |
| Control | 2.87 | 3.44 | | |
| 1' EMBT-D | 2.33 | 2.63 | 3.5 | 6.5 |
| 1b EBTP-D | 2.39 | 2.74 | 3.0 | 5.0 |
| 1d EBMP-D | 2.48 | 2.80 | 2.5 | 4.4 |
| 1c EBC12-D | 2.42 | 2.78 | 2.8 | 4.6 |
| 1a EBCP-D | 2.39 | 2.72 | 3.0 | 5.2 |

Having described the invention in detail and by reference to preferred embodiments thereof, it will be apparent that modifications and variations are possible without departing from the scope of the invention defined in the appended claims:

We claim:

1. A photohardenable composition comprising a free radical addition polymerizable or crosslinkable compound, a disulfide, and an ionic dye/reactive counter ion complex capable of absorbing actinic radiation and producing free radicals which initiate free radical polymerization or crosslinking of said polymerizable or crosslinkable compound, said disulfide represented by the structure

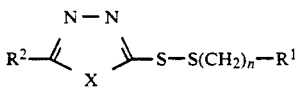
(IIa)

wherein n represents 0 or 1; X represents S or O; $R^2$ is selected from the group consisting of $R^1$—S—, $C_1$-$C_{20}$ alkyl sulfido, $C_1$-$C_{20}$ alkyl, $C_5$-$C_{12}$ cycloalkyl, —SH and H; and $R^1$ represents an aromatic radicals having 5 or 6 ring members, and in addition may be fused to an aromatic ring.

2. The composition of claim 1 wherein said composition is microencapsulated.

3. The photohardenable composition of claim 1 consisting essentially of a free radical addition polymerizable or crosslinkable compound, a disulfide, and an ionic dye/reactive counter ion complex capable of absorbing actinic radiation and producing free radicals which initiate free radical polymerization or crosslinking of said polymerizable or crosslinkable compound, said disulfide represented by the structure:

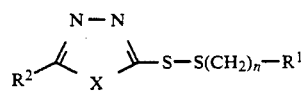

wherein n represents 0 or 1; X represents S or O; $R^2$ is selected from the group consisting of $R^1$—S—, $C_1$-$C_{20}$ alkyl sulfido, $C_1$-$C_{20}$ alkyl, —SH and H; and $R^1$ represents an aromatic radical having 5 or 6 ring members, and in addition may be fused to an aromatic ring.

4. A photohardenable composition consisting essentially of a free radical addition polymerizable or crosslinkable compound, a disulfide, and an ionic dye/reactive counter ion complex capable of absorbing actinic radiation and producing free radicals which initiate free radical polymerization or crosslinking of said polymerizable or crosslinkable compound, said disulfide being represented by the structure:

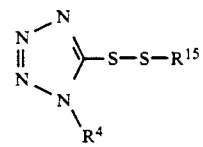

wherein $R^{15}$ represents an aromatic radical and $R^4$ is selected from the group consisting of $C_1$-$C_{20}$ alkyl, $C_5$-$C_{12}$ cycloalkyl, $C_7$-$C_{20}$ aralkyl, phenyl, naphthyl, mono or dihalogenated phenyl, mono or dihalogenated naphthyl, $C_2$-$C_{20}$ dialkylaminophenyl, and $C_2$-$C_{20}$ dialkylaminoaphthyl.

5. The composition of claim 4 wherein said composition is microencapsulated.

6. The composition of claim 4 wherein said disulfide is 1-phenyl-1H-tetrazol-5-yl disulfide having the structure:

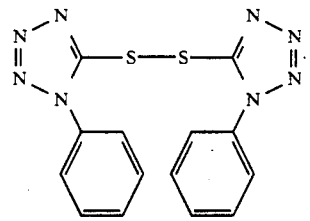

7. A photohardenable composition consisting essentially of a free radical addition polymerizable or crosslinkable compound, a disulfide, and an ionic dye/reactive counter ion complex capable of absorbing actinic radiation and producing free radicals which initiate free radical polymerization or crosslinking of the polymerizable or crosslinkable compound, said disulfide represented by the structure:

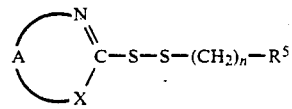

wherein X is selected from the group consisting of S and O; n represents 0 or 1; A represents the residue of the ring containing the N, C and X atoms, the ring containing five or six members and, in addition, said ring members may be fused to an aromatic ring; and $R^5$ is an aromatic radical selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring.

8. The composition of claim 7 wherein said disulfide is represented by the structure

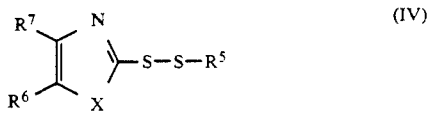

wherein $R^6$ and $R^7$ independently represent H, $C_1$-$C_{20}$ alkyl, $C_1$-$C_{20}$ aralkyl, phenyl or when together cyclized represent a fused aromatic ring which may be substituted; X is selected from the group consisting of S and O; and $R^5$ is selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring.

9. The composition of claim 8 wherein X is S, $R^7$ is phenyl, $R^6$ is H, and $R^5$ is selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl each of which may have a substituent on one or more C or N atoms of the ring.

10. The composition of claim 8 wherein said disulfide is represented by the structure

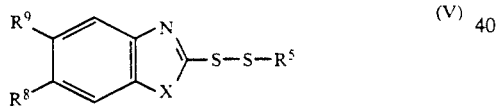

$R^8$ and $R^9$ are independently selected from the group consisting of H, $C_1$-$C_{20}$ alkoxy, $C_1$-$C_{20}$ alkyl, phenyl, naphthyl, and phenoxy; X is O or S; and $R^5$ is selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring.

11. The composition of claim 10 wherein X is S, $R^8$ is $C_1$-$C_6$ alkoxy or H; $R^9$ is H; and $R^5$ is selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring.

12. The composition of claim 11 wherein $R^5$ is phenyl, mono- or dihalogenated phenyl, phenyl substituted with $C_1$-$C_{20}$ alkoxy, or phenyl substituted with $C_1$-$C_{20}$ alkyl.

13. The composition of claim 12 wherein said disulfide is selected from the group consisting of 6-ethoxybenzothiazol-2-yl phenyl-disulfide (EBTP-D) having the structure:

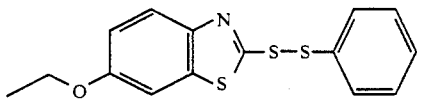

6-ethoxybenzothiazol-2-yl 4-methylphenyl-disulfide (EBMP-D) having the structure:

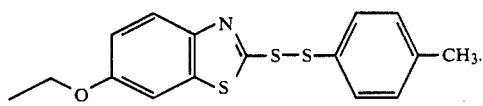

6-ethoxybenzothiazol-2-yl 4-dodecyloxyphenyl-disulfide (EBC12-D) having the structure:

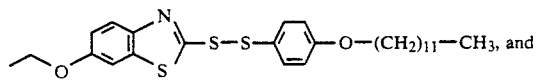

6-ethoxybenzothiazol-2-yl 4-chlorophenyl-disulfide (EBCP-D) having the structure:

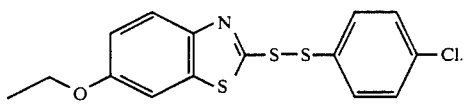

14. The composition of claim 11 wherein said disulfide is 6-ethoxymercaptobenzothiazol-2-yl disulfide (EMBT-D)

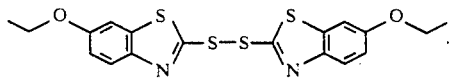

15. The composition of claim 11 wherein said disulfide is selected from the group consisting of 2-dimethylaminophenyl 6-ethoxybenzothiazol-2-yl disulfide having structure:

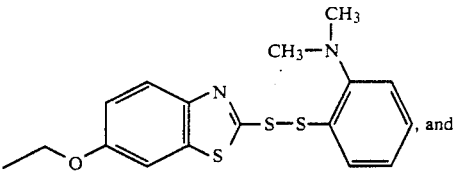

4-dimethylaminophenyl 6-ethoxybenzothiazol-2-yl disulfide having the structure:

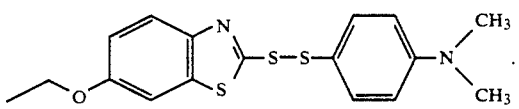

16. The composition of claim 10 wherein X is O; $R^8$ and $R^9$ are each H; and $R^5$ is selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring.

17. The composition of claim 10 wherein said disulfide is mercaptobenzothiazol-2-yl disulfide (MBO-D) having the structure:
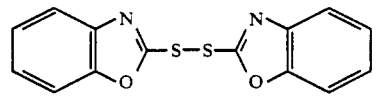
18. The composition of claim 7 wherein said composition is microencapsulated.
* * * * *

UNITED STATES PATENT AND TRADEMARK OFFICE
CERTIFICATE OF CORRECTION

PATENT NO. : 5,230,982
DATED : July 27, 1993
INVENTOR(S) : Paul G. Davis, et al.

It is certified that error appears in the above-identified patent and that said Letters Patent is hereby corrected as shown below:

Column 25, Line 7: the word "mercaptobenzothiazol" should be changed to -- mercaptobenzoxazol --.

Signed and Sealed this

Fifth Day of April, 1994

BRUCE LEHMAN

Attest:

Attesting Officer

Commissioner of Patents and Trademarks